United States Patent [19]
Bois et al.

[11] Patent Number: 5,506,418
[45] Date of Patent: Apr. 9, 1996

[54] ELECTROMAGNETIC WAVE DETECTOR WITH QUANTUM WELL STRUCTURE

[75] Inventors: Philippe Bois, Cesson; Emmanuel Rosencher, Bagneux; Borge Vinter, Paris; Jean Massies; Gérard Neu, both of Valbonne; Nicolas Grandjean, Mougins, all of France

[73] Assignee: Thomson-CSF, Paris, France

[21] Appl. No.: 407,660

[22] Filed: Mar. 21, 1995

Related U.S. Application Data

[63] Continuation of Ser. No. 86,862, Jul. 7, 1993, abandoned.

[30] Foreign Application Priority Data

Jul. 7, 1992 [FR] France .................................. 92 08384

[51] Int. Cl.[6] ...................... H01L 29/06; H01L 31/0328; H01L 31/0336
[52] U.S. Cl. ................................ 257/15; 257/17; 257/18; 257/21; 257/22
[58] Field of Search .................................. 257/21, 22, 17, 257/15, 18

[56] References Cited

FOREIGN PATENT DOCUMENTS

| 0407250 | 1/1991 | European Pat. Off. . |
|---|---|---|
| 0463907 | 1/1992 | European Pat. Off. . |
| 0488864 | 6/1992 | European Pat. Off. . |
| 0545787 | 6/1993 | European Pat. Off. . |
| 0545787A1 | 6/1993 | European Pat. Off. . |

OTHER PUBLICATIONS

Daryanani et al, "High Quantum Efficiency Strained In GaAs/AlGaAs Quantum–Well Resonant–Cavity Inversion Channel Bipolar Field–Effect Phototransistor," *Appl. Phys. Lett.* 59 (26), 23 Dec. 1991, pp. 3464–3466.
Köck et al, "Integrated Wavelength–Selective GaAs/AlGaAs Multi–Quantum–Well Detectors," *Semicond. Sci. Technol.*, vol. 6, No. 12 C, Dec. 1991, pp. C128–C129.
Applied Physics Letters, M. Sato, et al. vol. 56, No. 16, pp. 1555–1557, Apr. 16, 1992, New York, US, "Modulation of quantized levels of GaAs/AlGaAs quantum wells by InAs monomolecular plane insertion".
Semiconductor Science and Technology, Köck, et al. vol. 6, No. 12 C, C128–C129, Dec. 1991, London, GB, "Integrated wavelength–selective GaAs/GaAlAs multi–quantum–well detectors".
Applied Physics Letters, D. Daryanani, et al., vol. 59, No. 26, Dec. 23, 1992, New York, US, pp. 3464–3466, "High quantum efficiency strained InGaAs/AlGaAs quantum–well resonant–cavity inversion channel bipolar field–effect phototransistor".
SPIE, vol. 1361, "Physical Concepts of Materials for Novel Optoellectronic Device Applications I", Stradling, Nov. 1990, pp. 630–640, Novel narrow–gap semiconductor systems.
SPIE, vol. 1361, "Physical Concepts of Materials for Novel Optoelectronic Device Applications I" Sermage et al., Nov. 1990, pp. 131–135, Differentiation of the non radiative recombination properties of the two interfaces of MBE grown GaAs–GaAlAs quantum wells.
Applied Physics Letters, Zhou et al., vol. 54, No. 9, Feb. 27, 1989, New York, US, pp. 855–856, "Intersubband absorption in strained In (x) Ga (1–x)As/Al(O.4)Ga(0.6)As (0=x=0.15) multiquantum wells".

*Primary Examiner*—William Mintel
*Attorney, Agent, or Firm*—Oblon, Spivak, McClelland, Maier & Neustadt

[57] ABSTRACT

An electromagnetic wave detector formed of semiconductor materials includes at least one quantum well in which there is provided a fine layer of a material with a gap width that is smaller than that of the quantum well layer. For example, in the case of a GaAlAs/GaAs/GaAlAs, there is provision for a fine layer of InAs. In this way, the difference of energy levels between the two permitted levels is increased and detection of short wavelengths may be accomplished.

11 Claims, 6 Drawing Sheets

ELECTROMAGNETIC WAVE DETECTOR WITH QUANTUM WELL STRUCTURE

This application is a continuation of application Ser. No. 08/086,862, filed on Jul. 7, 1993, now abandoned.

BACKGROUND OF THE INVENTION

1. Field of the Invention

The invention relates to an electromagnetic wave detector made of a semiconductor material with quantum well structure, notably a detector that can be used for the detection of shorter wavelengths than those detected by known detectors.

2. Description of the Prior Art

The rapid advances made in the field of epitaxial growth on GaAs substrates have enabled the development of a new class of electromagnetic wave detectors using intraband transitions in quantum wells as shown in FIG. 1 and described in the document by E. ROSENCHER and P. Bois, Physical Review, B44, 11315 (1991).

The recent development of the performance characteristics of components of this type is related in particular to the fact that it is relatively easy to make multilayers of heterojunction semiconductors in the standard system of molecular beam epitaxy (MBE), i.e. the $GaAs/Ga_{1-x}Al_xAs$ system. By adjusting the growth parameters, the thickness of the quantum wells and the percentage x of aluminum in the barriers that dictate the confinement potential, it is possible to choose to center a narrow band (about 1 µm) of detection on a given wavelength (see FIG. 2). However, the use of the standard $GaAs_{1-x}Al_xAs$ system with $0 \leq x \leq 43\%$ entails a restriction, in terms of wavelength, to the 7–20 µm range. To overcome this restriction, and in particular to extend the scope of the device towards the 3–5 µm band, several approaches have been envisaged.

The first approach consists of increasing the percentage of aluminum of the barrier to over 43%. However, although this approach makes it possible to obtain materials with "standard" growth conditions, it is not optimal for reasons related to the band structure of the III–V type materials. Indeed, increasing the value of x amounts to increasing the confinement potential and hence the optical excitation energy but, because of the intersection of the X and F bands (see FIGS. 3a to 3c), the thermal excitation energy remains low (of the order of 120 meV). For this reason, the detector shown in FIG. 4 will effectively have an optical response in the 3–5 µm range, but with the signal-to-noise ratio and hence the BLIP temperature of a multiple quantum well detector working in the 8–12 µm range, i.e. $T_{BLIP} \approx 70$ K.

The second approach consists of deliberately choosing other pairs of III–V semiconductors such as GaInAs/AlInAs epitaxially grown on InP by MOCVD. This choice can be used to obtain components of optimal quality from the viewpoint of the intrinsic limitations, but has the disadvantage of using technologies that are less conventional and hence more difficult to implement.

The aim of this invention is to slightly modify the system of materials used so that it remains close to the MBE standard and is therefore easy to make.

SUMMARY OF THE INVENTION

The invention therefore relates to an electromagnetic wave detector made of a semiconductor material with a quantum well structure comprising at least one first quantum well layer sandwiched between a second barrier layer and a third barrier layer, the gap width of the first layer being smaller than the gap widths of the second and third layers, wherein the first layer of wells comprises at least one additional layer made of semiconductor material with a gap width smaller than that of the first layer and a thickness smaller than or equal to the thickness of the well.

BRIEF DESCRIPTION OF THE DRAWINGS

The different objects and features of the invention will appear, more clearly from the following description and from the appended figures, of which.

DETAILED DESCRIPTION OF THE PREFERRED EMBODIMENTS

The device according to the invention comprises a quantum well in which there is provided, in the quantum well layer, a layer with a thickness on the order of several atoms made of a material with a gap width that is smaller than that of the material constituting the quantum well. For example, in a GaAs/GaAlAs well, what is done is to introduce, into the material of the well, some atomic layers of material with a smaller gap width such as, for example, $Ga_{1-y}In_yAs$ with $0 \leq y \leq 1$ in order to lower the energy of the first permitted level in relation to the energy of the GaAlAs barriers.

Figure 5A:
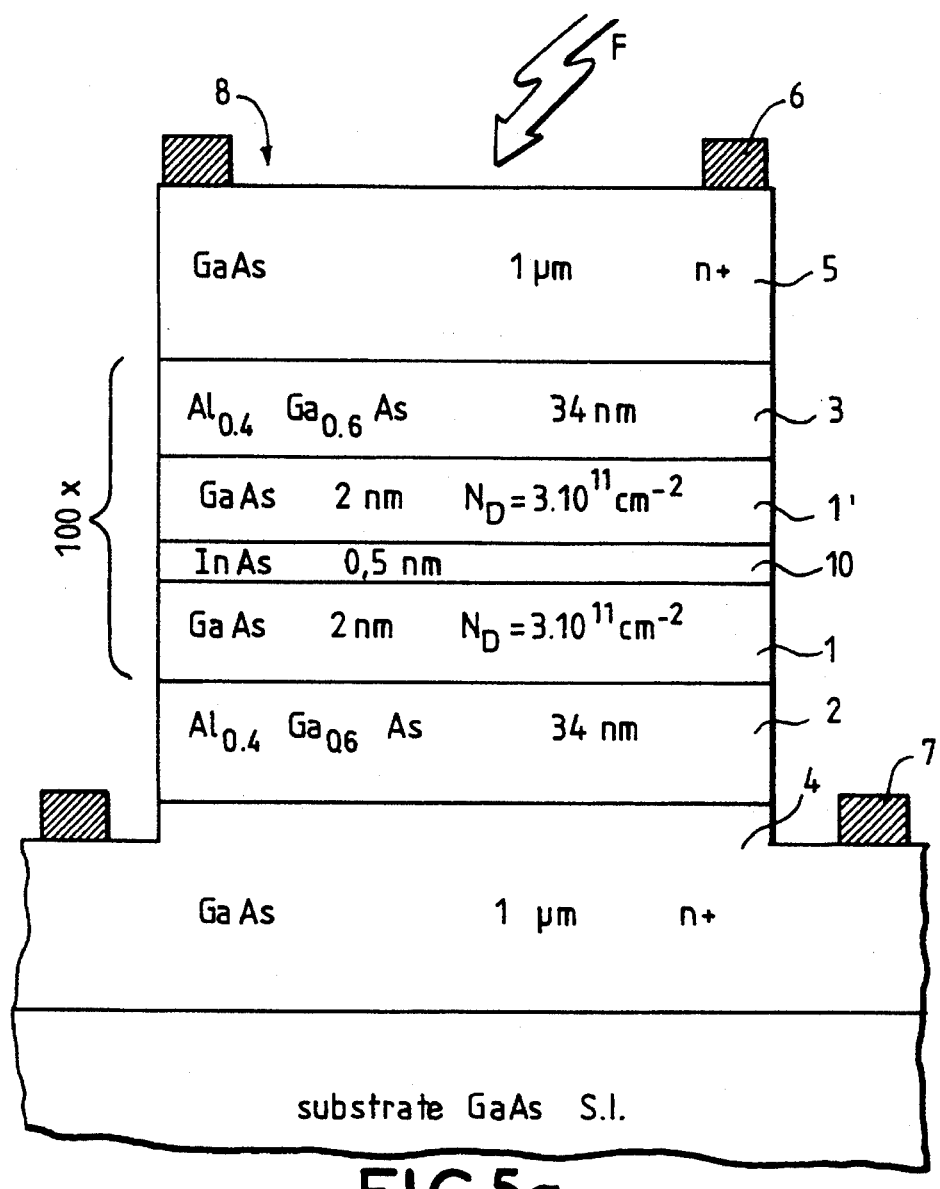
FIG. 5a shows a quantum well device according to the invention.

FIG. 5a illustrates a device such as this comprising at least one quantum well 1, 1', 10 sandwiched between two barrier layers 2 and 3, which are sandwiched between two layers 4 and 5 enabling ohmic contacts to be obtained. Metal contacts 6 and 7 are located on the layers 4 and 5. The contact 6 leaves a part of the external surface of the layer 5 uncovered thus enabling a luminous flux to reach the active part of the device. The contact 6 could also be transparent to the light wave to be detected and could then cover the entire layer 5.

In the layers 1, 1', the quantum well comprises a layer 10 with a thickness of a few atoms.

Figure 5B:
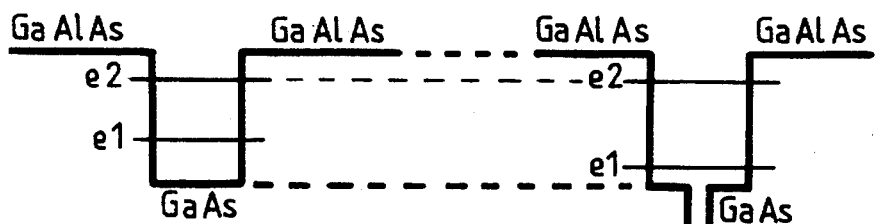
FIGS. 5b, 5c show diagrams of conduction bands bringing out the usefulness of the invention.
Figure 5C:

FIGS. 5b and 5c show diagrams of conduction bands highlighting the usefulness of the invention.

The diagram of FIG. 5b corresponds to a structure such as that of FIG. 5a but without any provision having been made for a layer 10. The quantum well of FIG. 5b has two levels e1 and e2, for which the difference in energies corresponds to a wavelength $\lambda_1$ liable to be detected.

By making provision for a layer 10 with a small gap width, a conduction band of the type shown in FIG. 5c is obtained. It can then be seen that the level e1 has a lower level of energy: this increases the energy difference between the levels e1 and e2 which then corresponds to a shorter wavelength.

During operation as a detector, the device of FIG. 5a enables the detection of the shorter wavelengths.

In the case of a quantum well constituted by layers of wells 1, 1' made of GaAs and barrier layers 2, 3 made of $Ga_{1-x}Al_xAs$, provision is made for at least one layer 10 made of InAs.

Figure 1:
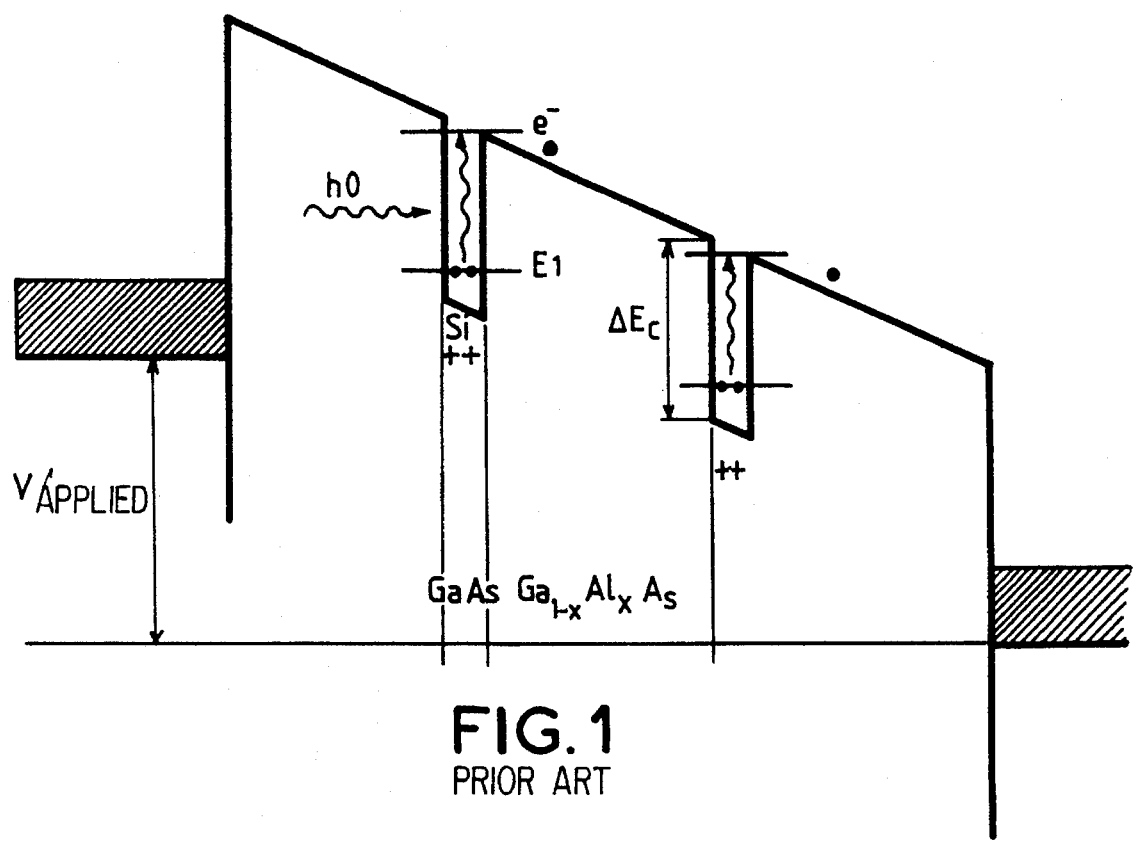
FIG. 1 shows a diagram of a conduction band illustrating the working of a quantum well detector.
Figure 2:
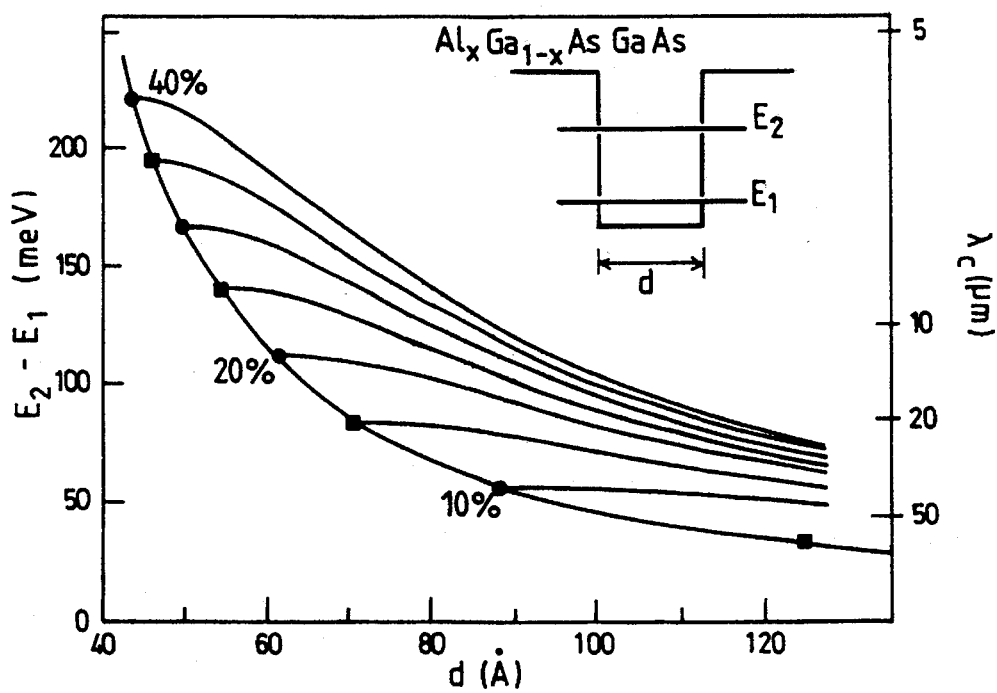
FIG. 2 shows layers giving, for $GaAs/Ga_{1-x}Al_xAs$ quantum well detectors having different concentrations x of aluminium, the values of the energy differences between two electron energy levels in the quantum wells.
Figure 3A:
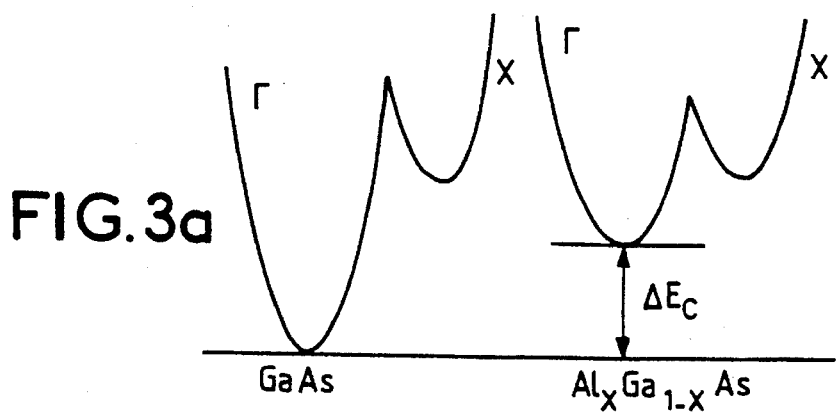
FIGS. 3a to 3c are curves showing the discontinuity of the conduction band of a GaAs/GaAs quantum well When the concentration varies from 0 to 100%.
Figure 3B:
Figure 3C:
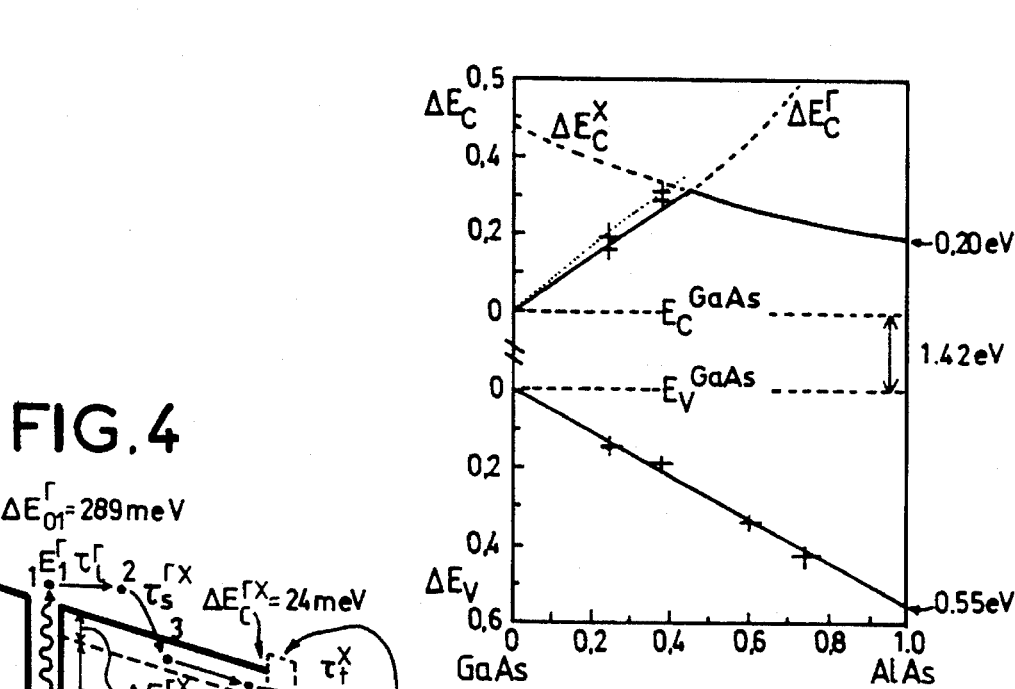
Figure 4:
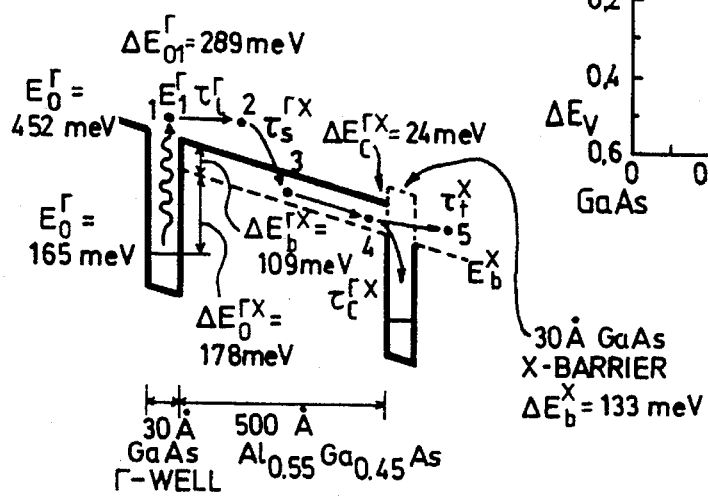
FIG. 4 is a conduction band diagram illustrating the mechanism of electronic conduction.
Figure 6:
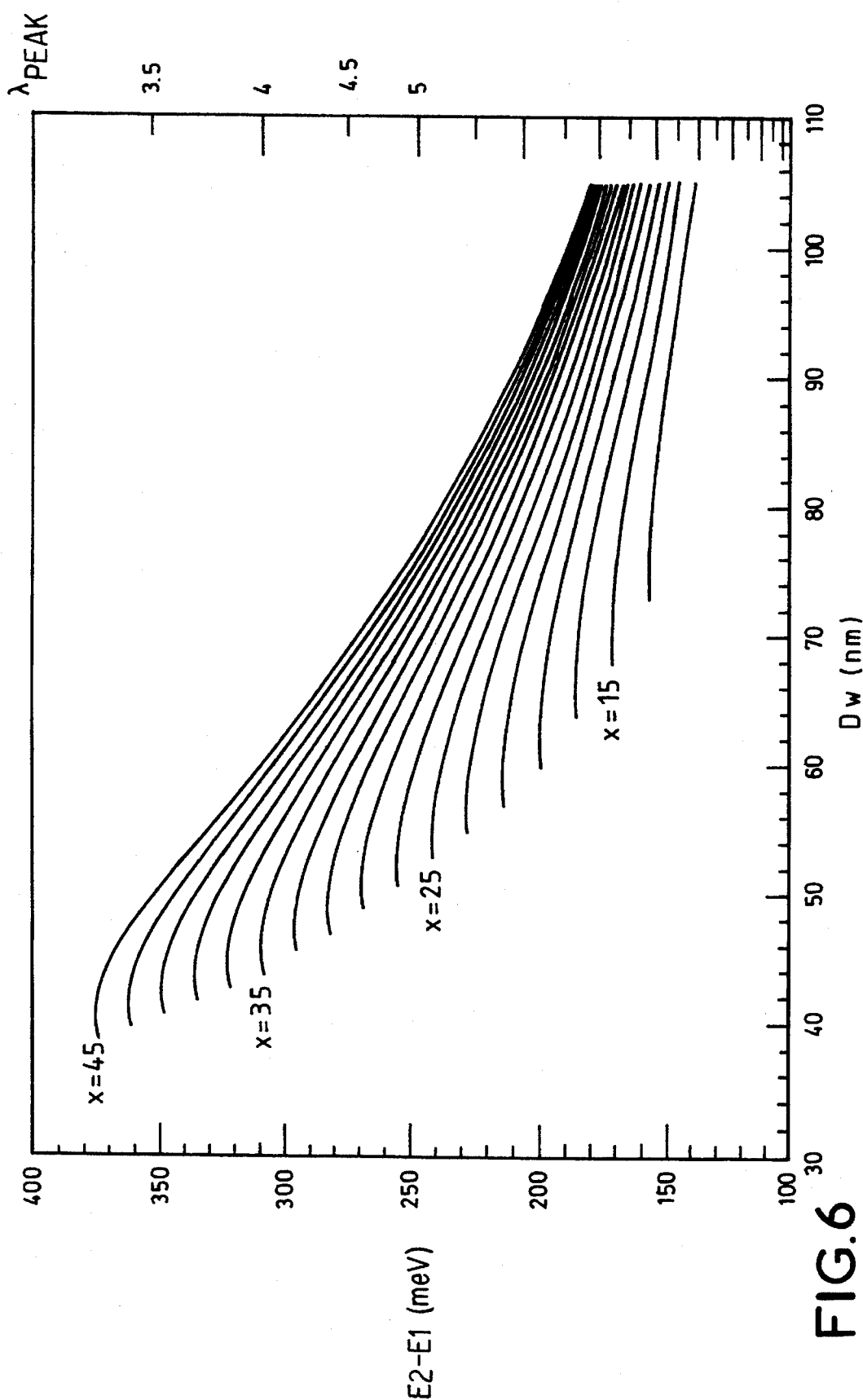
FIG. 6 shows curves giving, for a $GaAs/Ga_{1-x}Al_xAs$ quantum well modified according to the invention, and for different values of x, the energy differences between two energy levels of the quantum wells.

FIG. 6 shows the possibilities offered by the introduction of a layer 10 with a thickness of 0.5 nm (1.5 atomic monolayer). The different curves correspond to different aluminium compositions of the barrier layers. It is seen then that the device of the invention enables the detection of wavelengths ranging substantially from 3 µm to 7 µm while, without making provision for a layer 10, it is possible to detect wavelengths of 7 µm to 20 µm (see FIG. 2).

It is seen that, in this way, it is possible to extend the capabilities of multiple quantum well detectors of this type to 3.2 µm, hence to the hitherto inaccessible 3–5 µm band. This is done without introducing any radical modifications whether in the methods of growth or in the technological processes, while at the same time keeping the thermal properties inherent in this type of detector (higher $T_{BLIP}$).

Figure 7:
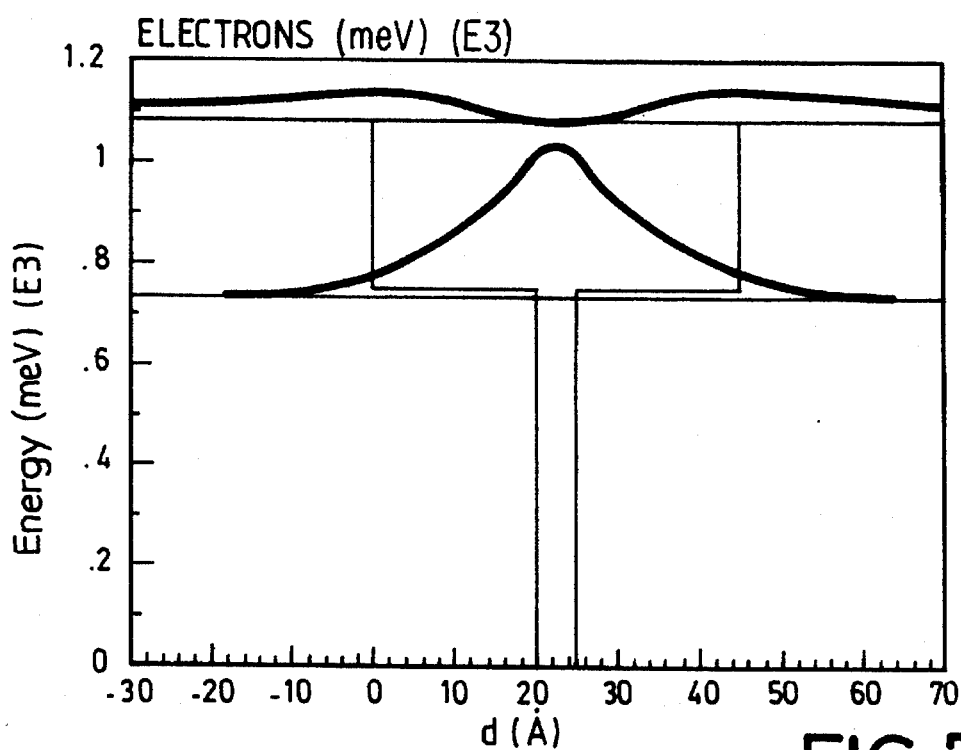
FIGS. 7 and 8 show diagrams of conduction bands of a device according to the invention.
Figure 8:
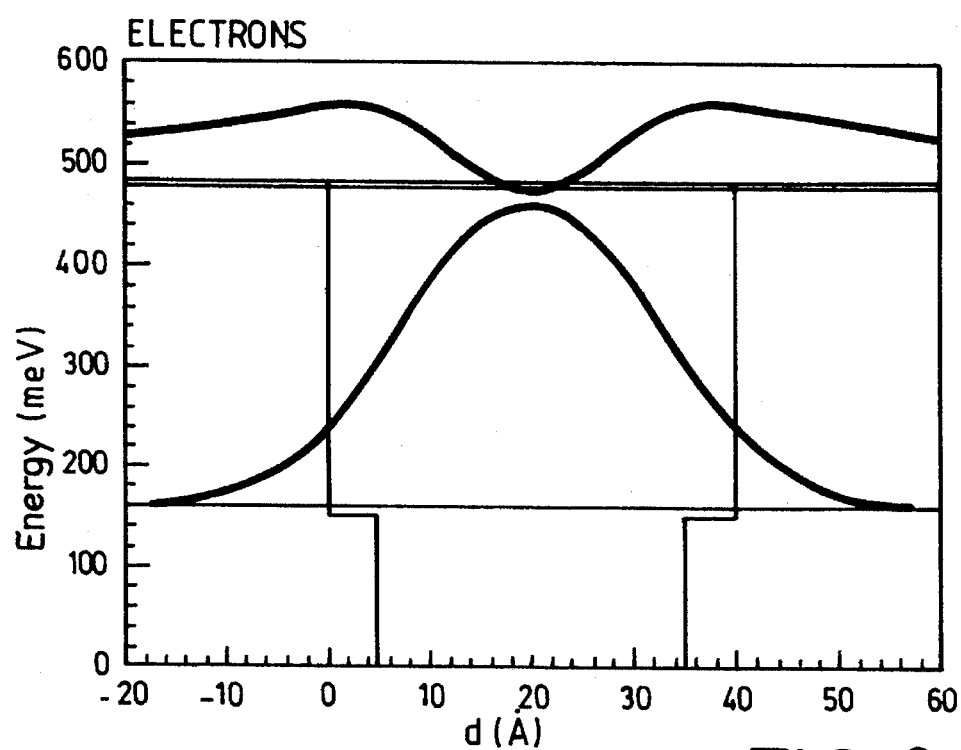

FIG. 7 gives a view, by way of an example, of the conduction band profile of a detector working at $\lambda_{peak} \approx 3.9$ µm, the active layer of which is a 34 nm stack of $Ga_{0.6}Al_{0.4}As$ barrier layers and of wells formed by 4 nm of Si doped GaAs and 0.5 nm of InAs It is also possible to use layers of $Ga_{0.8}In_{0.2}As$ and FIG. 8 shows an exemplary view of the conduction band profile of a detector working at $\lambda_{peak} \approx 3.6$ µm formed with the same barrier material.

According to one variant, it is even provided that the quantum level layer is made of GaAs throughout its thickness and that the barriers are made of GaAs. The idea of providing for indium in the well forms part of the invention: achieving it would not be obvious to those skilled in the art because of the differences in lattice parameters and the segregation of indium during the growth process.

In the forgoing exemplary embodiments, devices made of GaAs/GaAlAs have been described that can be used to function at short wavelengths (3 µm for example). The invention can also be used for for detectors at long wavelengths (8 to 12 µm) and the advantage of the invention then is that it enables the obtaining of a response that is five to ten times more efficient by providing notably for GaAlAs layers with 5% of aluminum for example.

Figure 9A:
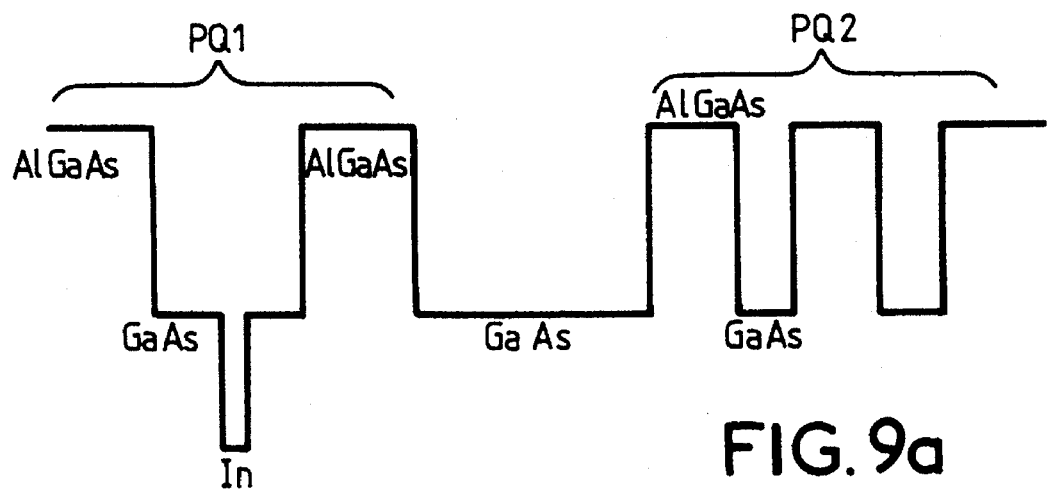
FIG. 9a is a conduction band diagram for the device of FIG. 9b.

The device of the invention can also be applied to the making of a detector of two different wavelengths (or a bicolor detector). For example, as is shown in FIGS. 9a and 9b, it has a first stack of layers PQ1 constituting a first quantum well according to the invention to detect the short wavelengths (3–5 pm for example) and a second stack of layers PQ2 constituting a second quantum well to detect wavelengths longer than the foregoing ones.

For example, the first stack PQ1 may be based on $Ga_{1-x}Al_xAs/GaAs$ with at least one layer of indium (or InAs) in the layer of the well. The second stack PQ2 may be based on $Ga_{1-x}Al_xAs/GaAs$.

The usefulness of a device such as this is that it can be manufactured with the same materials for both detectors, and that this can be done in one and the same epitaxial frame.

Figure 9B:
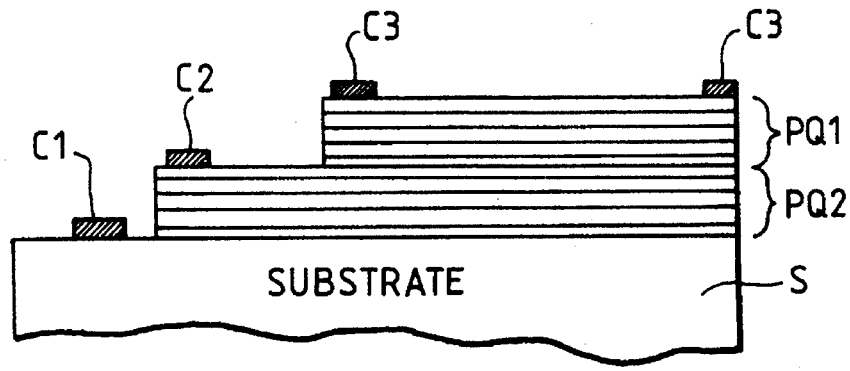
FIG. 9b illustrates a detector according to the present invention for detecting two different wavelengths.

The geometry of a detector such as this may be such as is shown by way of an example in FIG. 9b. It is such that, on a substrate S, there is the stack PQ1 used to detect the wavelengths of a first range (short for example) between the ohmic contacts C1 and C2. On the stack PQ1, there is the stack PQ2 used to detect the wavelengths of a range of longer wavelengths between the ohmic contacts C2 and C2.

Figure 10:
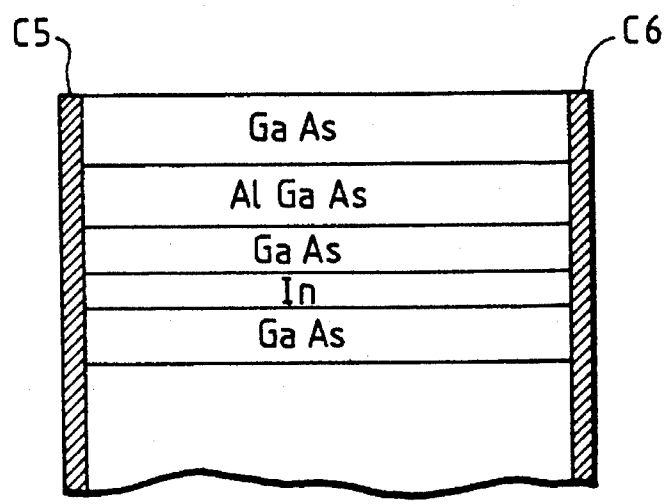
FIG. 10 illustrates a bolometer formed according to the principles of the present invention.

The invention can also be applied to the making of bolometers. In this case, the ohmic contacts C5, C6 used to measure the resistivity of the device are located on the flanks of the layers as shown in FIG. 10.

What is claimed is:

1. An electromagnetic wave detector formed of a semiconductor material having a quantum well structure, comprising:

at least one first quantum well layer sandwiched between a second barrier layer and a third barrier layer, bandgaps of said at least one first quantum well layer being smaller than bandgaps of said second and third barrier layers, wherein said at least one first quantum well layer comprises at least one additional layer comprising indium and having bandgaps smaller than those of said at least one first quantum well layer and thicknesses on the order of one or more atomic layers, and wherein said electromagnetic wave detector detects wavelengths in the range of 3 to 7 µm.

2. An electromagnetic wave detector formed of a semiconductor material having a quantum well structure, comprising:

at least one first quantum well layer sandwiched between a second barrier layer and a third barrier layer, bandgaps of said at least one first quantum well layer being smaller than bandgaps of said second and third barrier layers, said at least one first quantum well layer comprising GaAs and said second and third barrier layers being formed of $Al_xGa_{1-x}As$, wherein said at least one first quantum well layer also includes indium, and wherein said electromagnetic wave detector detects wavelengths in the range of 3 to 7 µm.

3. An electromagnetic wave detector according to claim 1, wherein said at least one first quantum well layer is GaAs-based, and said second and third barrier layers are AlGaAs-based.

4. An electromagnetic wave detector according to claim 2, wherein said at least one first quantum well layer is formed of $Ga_{1-y}In_ys$, y being greater than or equal to 0 and less than 1.

5. An electromagnetic wave detector according to claim 2, comprising contact layers on each side of said second and third barrier layers, said contact layers being formed of doped GaAs on which metal contacts are formed.

6. An electromagnetic wave detector according to claim 2, wherein thicknesses of said at least one first quantum well layer are on the order of several nanometers and thicknesses of said second and third barrier layers are on the order of several tens of nanometers.

7. An electromagnetic wave detector according to claim 2, wherein said second and third barrier layers are formed of $Ga_{1-x}Al_xAs$, x ranging from 0.1 to 0.5.

8. An electromagnetic wave detector according to claim 1, comprising a first stack of layers for detecting a first wavelength within a first range of wavelengths and a second stack of layers superimposed on said first stack of layers for detecting a second wavelength within a second range of wavelengths.

9. An electromagnetic wave detector according to claim 1, wherein said at least one first quantum well comprises, within a conduction band thereof, two energy levels having an energy difference therebetween which corresponds to the energy of a wave to be detected, said wave being detected by detecting a transition between said two energy levels represented by a current at terminals of said electromagnetic wave detector.

10. An electromagnetic wave detector according to claim 1, wherein said detector comprises a bolometer having ohmic contacts located on flanks of said at least one first quantum well layer, said second and third barrier layers, and said at least one additional layer.

11. An electromagnetic wave detector according to claim 1, wherein said at least one first quantum well layer is GaAs-based, said second and third barrier layers are AlAs-based, and said at least one additional layer is InAs-based.

* * * * *